United States Patent [19]

Poinelli

[11] Patent Number: 5,163,802
[45] Date of Patent: Nov. 17, 1992

[54] AUTOMATIC HANDLING OF DIFFERENT MAGAZINES BY STANDARDIZED PICK-UPS AND IDENTIFICATION CODES

[75] Inventor: Renato Poinelli, Casate Novo, Italy

[73] Assignee: SGS-Thomson Micoelectronics s.r.l., Italy

[21] Appl. No.: 802,700

[22] Filed: Dec. 5, 1991

Related U.S. Application Data

[63] Continuation of Ser. No. 559,944, Jul. 31, 1990, abandoned.

[30] Foreign Application Priority Data

Aug. 8, 1989 [IT] Italy ................. 83634 A/89

[51] Int. Cl.⁵ ................................ B65G 65/00
[52] U.S. Cl. ........................ 414/555; 209/583; 364/478; 414/DIG. 6; 901/1
[58] Field of Search ........ 414/555, 741, 273, DIG. 6, 414/550; 901/1; 294/93, 119.1, 902; 364/478; 209/583, 569

[56] References Cited

U.S. PATENT DOCUMENTS

| H320 | 8/1987 | Reuter | 364/478 X |
|---|---|---|---|
| 3,251,623 | 5/1966 | Fredholm | 294/93 X |
| 4,226,567 | 10/1980 | Van Orsdale, Jr. | 414/555 |
| 4,261,609 | 4/1981 | Kraszewski et al. | 414/741 X |
| 4,679,149 | 7/1987 | Merz | 364/478 |
| 4,698,775 | 10/1987 | Koch et al. | 901/1 X |
| 4,764,078 | 8/1988 | Neri | 901/1 X |
| 4,781,519 | 11/1988 | Monforte | 294/119.1 X |
| 4,790,709 | 12/1988 | Sakimori et al. | 414/741 X |
| 4,930,086 | 5/1990 | Fukasawa | 364/478 X |
| 4,945,429 | 7/1990 | Munro et al. | 414/273 X |

FOREIGN PATENT DOCUMENTS

304342 2/1989 European Pat. Off. ........... 414/555

Primary Examiner—David A. Bucci
Attorney, Agent, or Firm—Pollock, Vande Sande & Priddy

[57] ABSTRACT

A robotized handling and transfer system for magazines of different configuration for semiconductor devices production lines utilizes magazines which are provided with standardized pick-up implements receiving elements and with an identification bar code affixed in a geometrically fixed spatial position in respect to the receiving elements. A mobile arm of the transfer robot is provided with an expansion type pick-up head, suitable for any kind of magazine. Upon each pick-up action, the mobile arm presents the picked-up magazine to a bar code reader mounted on the self-propelled robot for determining the type of magazine and consequently the area where the latter is to be deposited. The pick-up expansion head accesses from above a space confined by the structure of the magazine so it does not encumber stacking or arranging the magazines closely together.

5 Claims, 3 Drawing Sheets

AUTOMATIC HANDLING OF DIFFERENT MAGAZINES BY STANDARDIZED PICK-UPS AND IDENTIFICATION CODES

This application is a continuation of application Ser. No. 07/559,944 filed Jul. 31, 1990, now abandoned.

BACKGROUND OF THE INVENTION

1. Field of the Invention

The present invention relates to a robotized transfer system for containers or magazines having different configurations utilized in semiconductor device production lines.

2. Description of the Prior Art

The production of integrated circuits or more generally semiconductor integrated devices is an example of very large scale fabrication and widely exploits, for obvious cost abatment considerations, highly automatized production lines exploiting self-propelled robots for handling and transferring the components being assembled. Normally these components have relatively small dimensions and/or are relatively fragile mechanically and it is a common practice for automatically handling and transferring them to employ specific magazines capable of containing a certain number of pieces in an orderly and safe way. These magazines have shapes and dimensions necessarily very different among each other, each being specifically designed and constructed for transporting objects and component parts very much dissimilar from one another: such as for example wafers, metal frames for assemblying the dies, stamped strips or ribbons of lead frames, etc.. For these reasons, the robots for handling and transferring these magazines along the production line must be specifically equipped for handling a certain type of magazine, and this often requires the substitution of the pick-up pincers at the extremity of a mobile arm thereof.

Typical magazines for wafers and for metal frames are respectively shown in FIGS. 1 and 2. Commonly these magazines are made of plastic or metallic material and are provided with two external lateral grooves 1 and 2 along the upper rim of the magazine, wherein the two jaws of the pick up pincers of the mobile arm of the transfer robot exert their grip. As it is easily understandable from the figures, the shapes and dimensions of the magazines which are often much dissimilar among each other, entail the use of special pincers or the substitution of one type of pincers with another type suitable for the particular type of magazine to be handled next. Another drawback is represented by the fact that the pick-up pincers necessarily present a substantially larger encumbrance than the magazine itself (at least in the direction of action of the jaws of the pincers) and this may represent a problem for handling these magazines within recesses, e.g. for depositing the magazine in a preordered location on a machine or on a testing apparatus or for permitting an easy arraying of several magazines one against the other within a "buffer" housing or platform.

OBJECTIVES AND SUMMARY OF THE INVENTION

In view of this state of the art, the present invention provides an automatic handling and transfer system employing the same type of self-propelled robots and by which all the robots may have a substantially identical configuration and therefore be immediately interexchangeable without needing to modify their pick-up mechanism in function of the particular type of container or magazine to be handled. This is achieved, in accordance with the present invention, by employing a standardized pick-up mechanism for all kinds of containers and/or magazines which are used in the production lines and by providing each magazine with an identification bar code which is geometrically located in a fixed spatial position in respect to the pick-up implements receiving recesses or grooves present on the magazine structure. In this way, while the pick-up implements of the mobile arm of anyone robot are indifferently suitable to pick-up any type of magazine, as long as the latter is provided with such a standardized pick-up implements receiving means, said identification bar code which is read after every pick-up by a bar code reader present in a fixed location on the robot structure and to which location the picked-up magazine is presented by the same mobile arm of the robot, determines either the deposition of the picked-up magazine on a respective transfer buffer platform among the many platforms which are present on the self-propelled robot or on an allocated load platform on a test machine or else of the production line.

Advantageously the standardized pick-up implements receiving recesses of any magazine is configured so as to cooperate with expansion type pick-up "pincers" and the pick-up terminal or head of the mobile arm is able to access from above and intrude into a space substantially confined within the overall plan view dimensions of the magazine itself, thus avoiding that the pick-up terminal of the mobile arm project beyond the encumbrance profile of the magazine itself. This greatly facilitates and renders the handling more efficient.

BRIEF DESCRIPTION OF THE DRAWINGS

The different aspects and advantages of the invention will become evident through the following detailed description of an embodiment thereof and with reference to the appended drawings, wherein:

As already said, FIGS. 1 and 2 show two common types of transfer magazines used in known systems, respectively for wafers 3 in FIG. 1 and for strips of stamped metal frames 4 in FIG. 2. Commonly these magazines are formed by two opposed, grooved plates 5 and 6, joined together by a spacing cross beam 7 (FIG.

Figure 1:
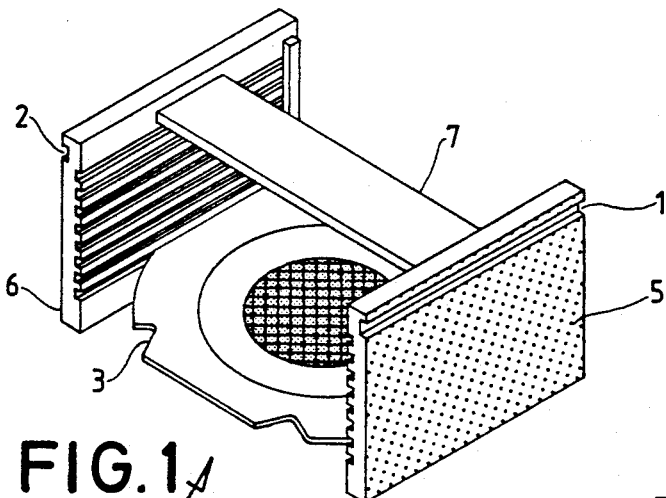
FIG. 1 is a schematic perspective view of a transfer magazine for handling wafers, in accordance with a known technique.
Figure 2:
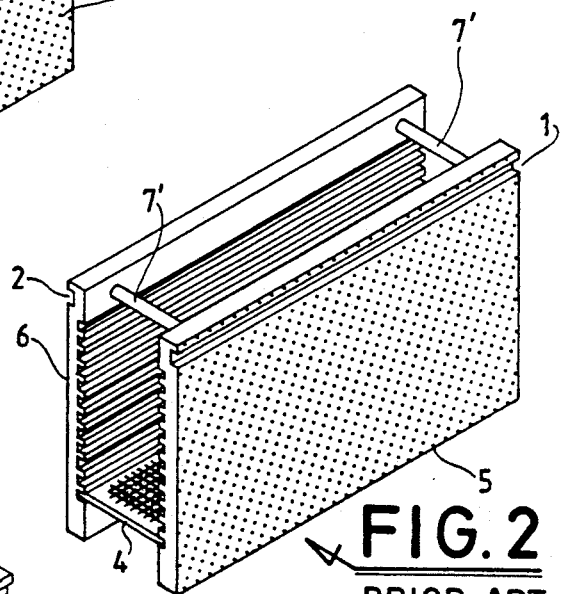
FIG. 2 is a perspective, schematic view of a transfer magazine for handling strips of stamped metal frames, according to the same known technique.

1) or by a pair of spacing pins 7' (FIG. 2). The grooves present on the opposed internal faces of the two plates form as many supports shelves for the wafers 3, in the case of the specific magazine of FIG. 1, or for the strips of stamped metal frames 4, in the case of the magazine of FIG. 2. According to a known technique, along the upper edges of the magazines and on the external faces of the two opposed plates thereof, the longitudinal grooves 1 and 2 are formed and which provide the seats into which the tips of the jaws of the pick-up pincers, mounted at the extremity of the mobile arm of a transfer robot (not shown in the figures) exert their gripping action.

DESCRIPTION OF THE PREFERRED EMBODIMENT

Figure 3:
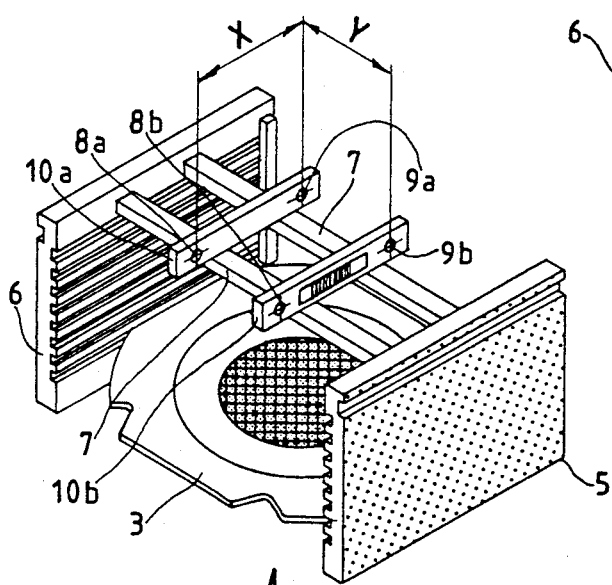
FIG. 3 is a perspective, schematic view of a transfer magazine for handling wafers, made in accordance with the present invention.
Figure 4:
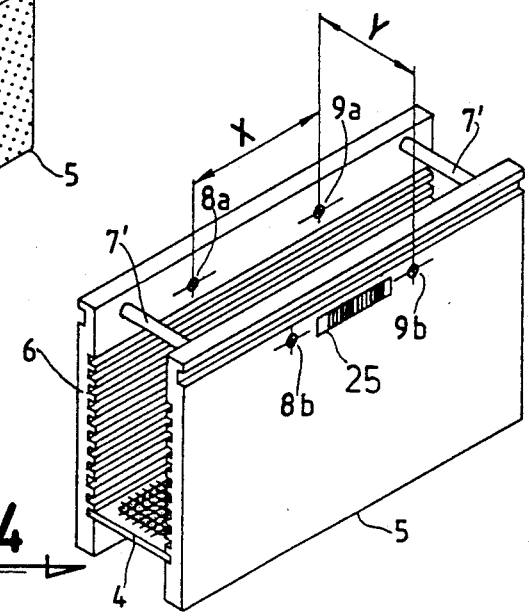
FIG. 4 is a perspective, schematic view of a transfer magazine for handling strips of stamped metal frames, made in accordance with the present invention.

Containers or magazines for wafers and for strips of stamped metal frames, functionally equivalent to those of the prior art depicted in FIGS. 1 and 2, are shown in FIGS. 3 and 4, respectively. The same numbers are used for identifying substantially similar parts of the magazines. The pick-up implements receiving recesses of the magazines of the system of the invention are, in the examples shown, constituted by two pairs of opposed seats, respectively 8a, 8b and 9a, 9b, which, in the case shown, are two pairs of reciprocally coaxial holes longitudinally, spaced apart by a distance X and wherein the coaxial holes of each pair are spaced apart from one another by a distance Y, as shown in the figures. The Y distance may, as in the case shown, correspond to the distance of separation between the opposing side plates 6 and 5 of the magazine of FIG. 4, designed for handling strips of stamped metal frames 4, and this separating distance between the opposed holes of each pair is kept also for the case of the magazine depicted in FIG. 3, designed for handling wafers, which is necessarily wider than the former magazine of FIG. 4. This is achieved by forming a functionally appropriate carrying structure of the magazine which comprises the two spaced cross beams 7 connecting the two side plates 5 and 6 and also two longitudinal members 10a and 10b, parallel to each other and spaced by a distance Y, through which the two longitudinally spaced apart pairs of pick-up holes 8a, 8b and 9a, 9b are formed.

Of course these pick-up implements receiving means present on the magazines and assuming the general aspect of longitudinally spaced pairs of opposing holes or recesses, will be geometrically identical for any type of magazine utilized in the handling and transfer system and preferably their spatial position will be substantially centered about the center of gravity of the magazine.

In any case, the opposing surfaces on which said pairs of holes are formed define a space which is accessible from above by an expansion pick-up head, the outer profile of which remains substantially contained within the outer profile of the magazine being handled, in a plan-wise view.

Figure 5:
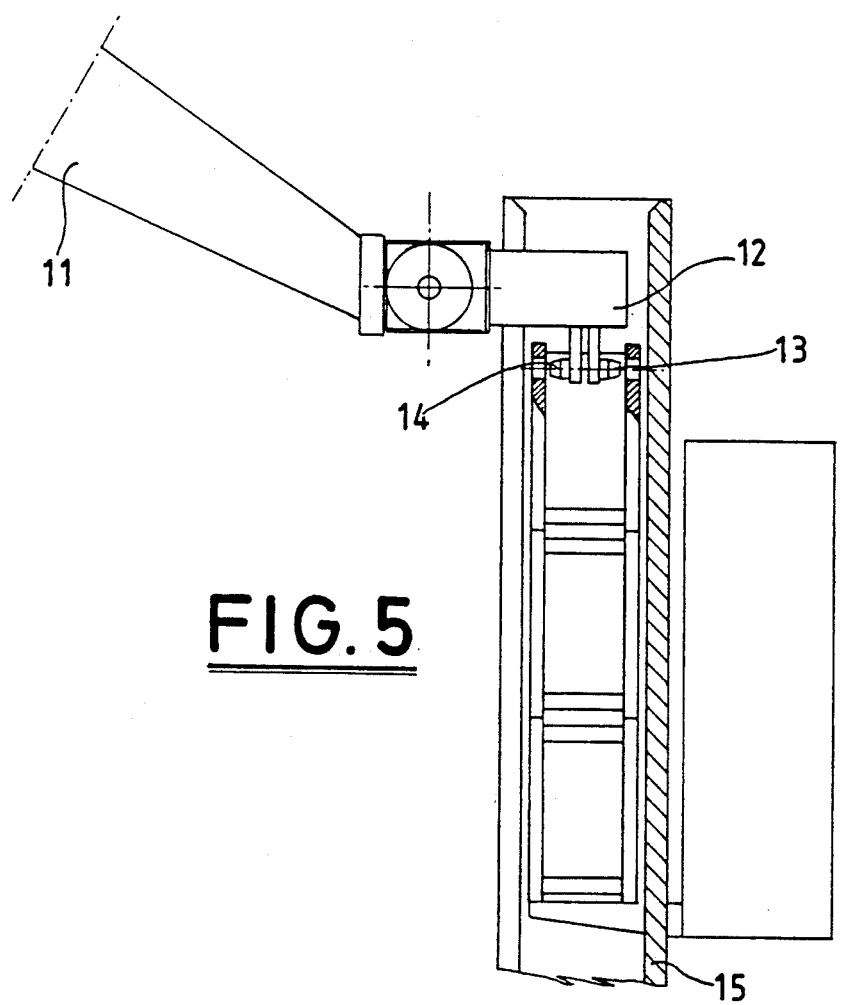
FIG. 5 is a schematic, partially sectioned, elevation view of the extremity of a mobile arm of a transfer robot and of the pick-up implements used in accordance with the present invention.
Figure 6:
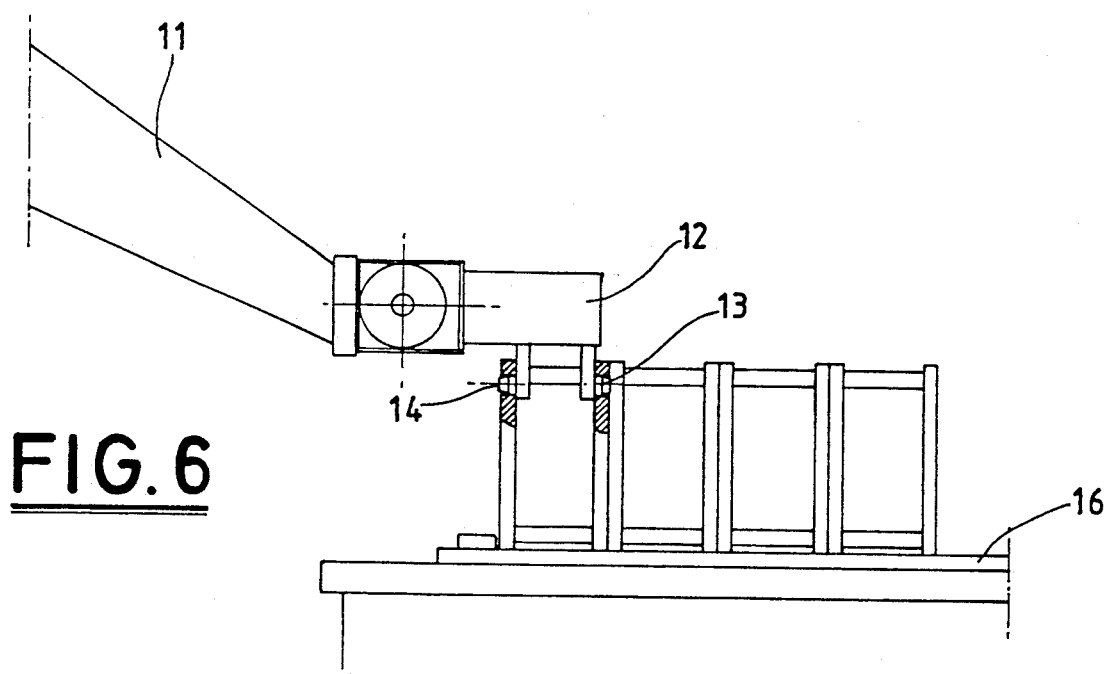
FIG. 6 is a schematic, partially sectioned, elevation view showing a magazine being deposited on a specific transfer buffer platform by the robot's mobile arm, in accordance with the present invention.

The engagement action of the expansion "pincers" is shown schematically in FIGS. 5 and 6, which show how the picking-up by the mobile arm 11 of a transfer robot of a magazine takes place. The pick-up head 12 is a sort of expansion pincers provided with as many pairs of projectable and retractable coaxial pins 13 and 14 as many are the spaced pairs of opposed coaxial holes in the magazine. The pins are capable of being projected from a retracted position shown in FIG. 5 to a fully extended pick up position shown in FIG. 6, wherein the two pins 13 and 14 forming one of said pairs engage the respective seats formed by one pair of coaxial holes present in the magazine, as described in FIGS. 3 and 4, and vice-versa. These expansion "pincers" permit, in respect to normal pincers, to contain the encumbrance thereof within the over-all encumbrance of the magazine itself, thus permitting to position a picked-up magazine directly against a wall 15, as schematically depicted in FIG. 5, or a previously deposited magazine on a resting buffer platform 16, as schematically depicted in FIG. 6.

Figure 7:
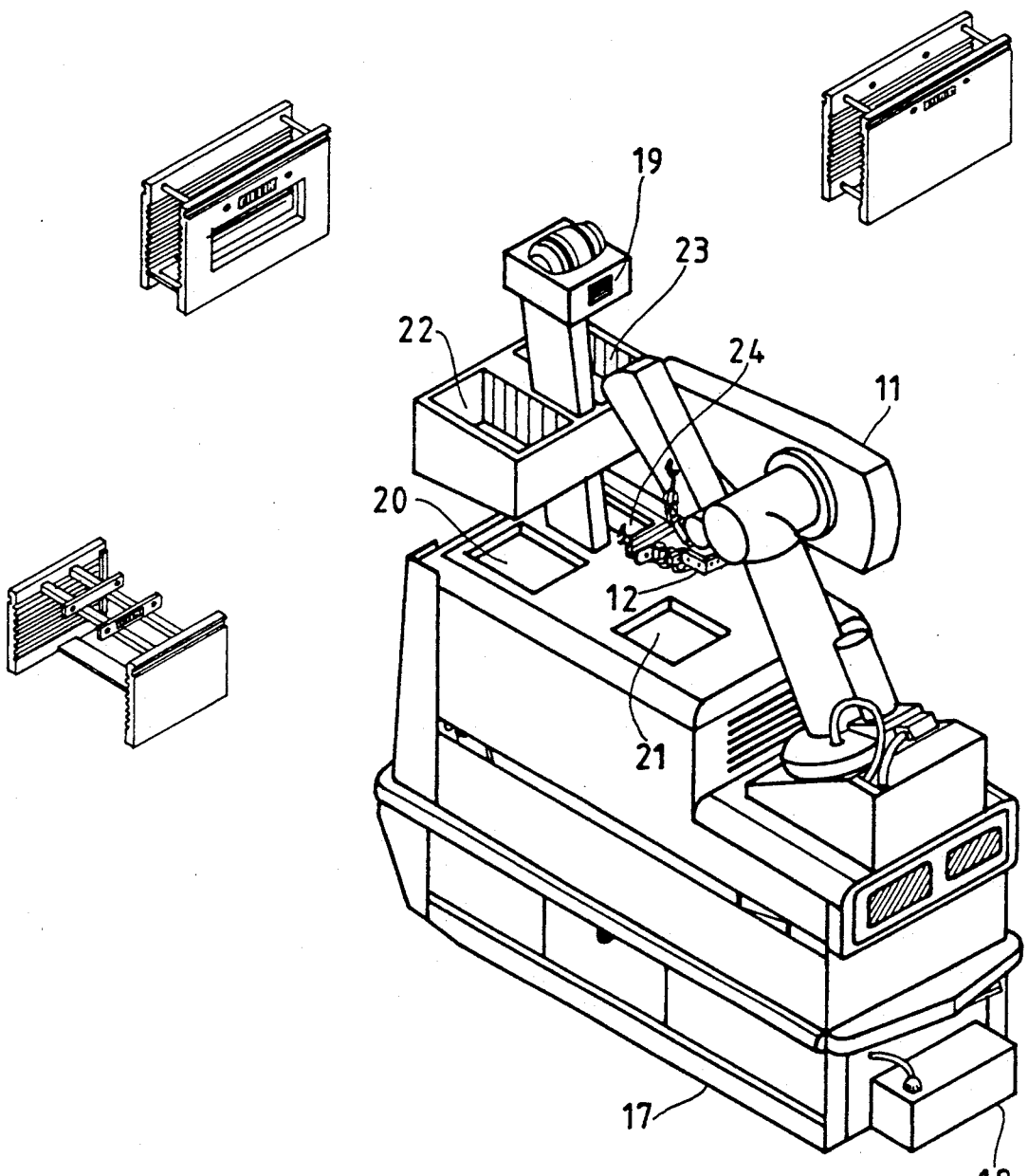
FIG. 7 is a schematic, perspective view of a transfer robot utilized in the system of the present invention.

A handling and transfer system made in accordance with the present invention is schematically depicted in FIG. 7. A selfpropelled robot used by the system is generally indicated with 17. The robot is provided with a central guidance unit 18 and is provided with a mobile arm generally indicated with 11. The mobile arm is provided at its extremity with an expansion type pick-up head 12 for picking-up the magazines, as shown in the preceding FIGS. 5 and 6. Moreover the self propelled robot is provided, in a relatively fixed position, with a bar code reader 19 and with a certain number of housings or platforms (20, 21, 22, 23 and 24) each of which is specifically prearranged for accommodating a certain number of a specific type of magazines to be transferred, as schematically shown in FIG. 7. Every magazine has the same standardized pick-up implements accommodating recesses as shown in detail in FIGS. 3 and 4 and a bar code 25 which is placed in a spatially univocal position in respect to said standardized pick-up means present thereon.

After each pick-up, the magazine is presented automatically by the mobile arm 11 in a position so as to permit the reading of the bar code 25 by the reader 19. This determines the type of magazine being handled by the mobile arm and, in function of a guidance program, authorizes the deposition of the so-recognized magazine in the specific area or buffer platform (20, 21, 22, 23 or 24) present on the self-propelled robot.

It is evident how the system object of the present invention is advantageously free of the drawbacks and limitations of the known systems, thus fully matching the stated objectives.

As it will be evident to the skilled technician, the conformation of the standardized pick-up implements receiving means present on the transfer magazines may be modified or realized in other forms. In particular the presence of at least two spaced pairs of opposing holes or recesses is not necessary, being a single pair of recesses having a suitable polygonal cross section so as to determine a stable pick-up condition sufficient, or more than two pairs of opposed holes or recesses may be used while utilizing a cooperating expansion type pick-up head provided with a matching array of expandable pins.

What I claim is:

1. A robotized handling and transfer system for magazines of different configurations for semiconductor device production lines comprising: at least one self-propelled robot having a plurality of transfer platforms of receiving respectively different types of magazines having different configurations to be transferred, a mobile arm terminated with a pick-up head, and a bar code reader means on a fixed position on said robot for reading a bar code indicia affixed no a surface of said magazines, said bar code indicia identifying a position on one of said transfer platforms or depositing each of said magazines, each magazine to be handled irrespective of its functional configuration being provided with at least a pair of opposed seats formed respectively on two facing spaced-apart counter-opposed vertical surfaces of the magazines, which surfaces define a space therebetween which is accessible from above by said pick-up head of said mobile arm, said pick-up head having projectable and retractable pick-up pins capable of being engaged in said opposed seats on said surface of the magazine when in a projected position, the magazine further including said bar code indicia affixed in a geometrically fixed spatial position in respect to said seats receiving opposed pick-up pins.

2. The system in accordance with claim 1, wherein said pair of opposed seats are two longitudinally spaced-apart pairs of opposed coaxial holes which are formed in said spaced apart, vertical surfaces of the magazine which face each other.

3. A robotized handling and transfer system for use in a semiconductor device production line comprising:

a plurality of magazines for handling different types of semiconductor products, said magazines including first and second parallel side plates commonly spaced, each plate having a pair of commonly spaced-apart seats for receiving a single pair of handling pins, and having bar code indicia commonly located on said side plates identifying where said magazines are to be transferred;

a self-propelled robot having a plurality of transfer platforms for receiving different magazines, said robot having a mobile arm having a pick-up head having first and second pairs of pins which are inserted into said spaced-apart seats and for moving said magazines to a position where a bar code reader can read said bar code indicia, and thereafter locate a grasped magazine onto a platform identified by said bar code indicia.

4. The robotized handling system of claim 3 wherein said pairs of spaced-apart seats face each other, and said pick-up head handling pins are positioned between said parallel side plates and expanded into engagement with said spaced-apart seats.

5. The robotized handling system of claim 3 wherein said bar code indicia is positioned between first and second seats of one of said pairs of seats.

* * * * *